(12) United States Patent
Lee et al.

(10) Patent No.: US 11,004,504 B2
(45) Date of Patent: May 11, 2021

(54) CONTROLLER, MEMORY SYSTEM INCLUDING THE CONTROLLER, AND OPERATING METHOD OF THE MEMORY SYSTEM

(71) Applicant: SK hynix Inc., Gyeonggi-do (KR)

(72) Inventors: Dong Uk Lee, Gyeonggi-do (KR); Hun Wook Lee, Incheon (KR)

(73) Assignee: SK hynix Inc., Gyeonggi-do (KR)

( * ) Notice: Subject to any disclaimer, the term of this patent is extended or adjusted under 35 U.S.C. 154(b) by 27 days.

(21) Appl. No.: 16/460,422

(22) Filed: Jul. 2, 2019

(65) Prior Publication Data

US 2020/0201726 A1 Jun. 25, 2020

(30) Foreign Application Priority Data

Dec. 19, 2018 (KR) ......................... 10-2018-0165616

(51) Int. Cl.
*G11C 11/56* (2006.01)
*G06F 11/22* (2006.01)
*G06F 11/10* (2006.01)
*G11C 29/42* (2006.01)
*G06F 13/16* (2006.01)

(52) U.S. Cl.
CPC ........ *G11C 11/5642* (2013.01); *G06F 11/102* (2013.01); *G06F 11/2215* (2013.01); *G06F 13/1668* (2013.01); *G11C 29/42* (2013.01)

(58) Field of Classification Search
CPC ....... G11C 29/42; G11C 16/26; G11C 16/349; G06F 11/2215; G06F 11/102; G06F 11/1012; G06F 12/0246; G06F 11/5642
See application file for complete search history.

(56) References Cited

U.S. PATENT DOCUMENTS

| 2009/0049364 | A1* | 2/2009 | Jo | G11C 11/5642 |
| | | | | 714/763 |
| 2013/0080858 | A1* | 3/2013 | Lee | G11C 16/349 |
| | | | | 714/773 |
| 2014/0063967 | A1* | 3/2014 | Ahn | G11C 16/26 |
| | | | | 365/185.18 |
| 2014/0101519 | A1* | 4/2014 | Lee | G11C 16/26 |
| | | | | 714/773 |
| 2015/0113207 | A1* | 4/2015 | Shin | G06F 12/0246 |
| | | | | 711/103 |
| 2020/0133767 | A1* | 4/2020 | Yang | G06F 11/1012 |

FOREIGN PATENT DOCUMENTS

KR 10-2017-0062254 6/2017
KR 10-2018-0064088 6/2018

* cited by examiner

*Primary Examiner* — Shelly A Chase
(74) *Attorney, Agent, or Firm* — IP & T Group LLP

(57) ABSTRACT

A controller comprises an error correction circuit configured to check an error bit number of error bits in the read data and correct the error bits; a read retry range setting circuit configured to reset a preset read retry range with respect to the read data, and set a new read retry range based on the error bit number and an error correction capability of the error correction circuit; a read voltage setting circuit configured to reset the set read voltage and set, as a new read voltage, a voltage among a plurality of voltages of the reset read retry range, corresponding to the new read retry range; and a flash control circuit configured to control the memory device to perform a read retry operation on the stored data, using the new read voltage.

19 Claims, 11 Drawing Sheets

CONTROLLER, MEMORY SYSTEM INCLUDING THE CONTROLLER, AND OPERATING METHOD OF THE MEMORY SYSTEM

CROSS-REFERENCE TO RELATED APPLICATION

The present application claims priority under 35 U.S.C. § 119(a) to Korean patent application number 10-2018-0165616, filed on Dec. 19, 2018, which is incorporated herein by reference in its entirety.

BACKGROUND

Field of Invention

The present disclosure generally relates to an electronic device, and more particularly, to a controller, a memory system including the controller, and an operating method of the memory system.

Description of Related Art

The paradigm for the recent computer environment has been turned into a ubiquitous computing environment in which computing systems can be used anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In an example of memory systems having such advantages, the data storage device includes a universal serial bus (USB) memory device, memory cards having various interfaces, and a solid state drive (SSD).

The memory device is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied.

Examples of the volatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), and a Ferroelectric RAM (FRAM). The flash memory is classified into a NOR type flash memory and a NAND type flash memory.

SUMMARY

Embodiments provide a controller capable of rapidly setting a read voltage in a read operation, a memory system including the controller, and an operating method of the memory system.

In accordance with an aspect of the present disclosure, there is provided a controller for controlling a memory device to provide read data by reading stored data using a set read voltage, in response to a read request from a host, the controller comprising: an error correction circuit configured to check an error bit number of error bits in the read data and correct the error bits; a read retry range setting circuit configured to reset a preset read retry range with respect to the read data, and set a new read retry range based on the error bit number and an error correction capability of the error correction circuit; a read voltage setting circuit configured to reset the set read voltage and set, as a new read voltage, a voltage among a plurality of voltages of the reset read retry range, corresponding to the new read retry range; and a flash control circuit configured to control the memory device to perform a read retry operation on the stored data, using the new read voltage.

In accordance with another aspect of the present disclosure, there is provided a memory system including: a memory device configured to store data; and a controller configured to set a read voltage by checking an error correction capability of an error correction circuit, and control the memory device to read the stored data, using the set read voltage, in response to a read request from a host.

In accordance with still another aspect of the present disclosure, there is provided a method for operating a memory system, the method including: checking an error correction circuit of the memory system; setting a read retry range including a plurality of voltages, based on the check result; setting, as a read voltage, a voltage among the plurality of voltages; performing a read operation of a memory device, using the set read voltage; performing an error correction operation on read data by the read operation to determine an error bit number of the read data; and resetting the read voltage by resetting the read retry range when the error bit number is greater than a set number.

In accordance with another aspect of the present disclosure, there is provided a memory system including: a memory device suitable for storing data; and a controller including an error correction code (ECC) circuit, suitable for: determining a first read retry range including a plurality of read voltages based on a type of the ECC circuit; performing a first read operation on the memory device based on a read voltage of the plurality of read voltages, to receive read data from the memory device; when the number of failed bits in the read data is greater than a threshold number, changing the first read retry range to a second read retry range, which is narrower than the first read retry range, the second read retry range including multiple read voltages; and performing a second read operation on the memory device based on a read voltage of the multiple read voltages.

BRIEF DESCRIPTION OF THE DRAWINGS

Example embodiments will now be described more fully hereinafter with reference to the accompanying drawings; however, the examples may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
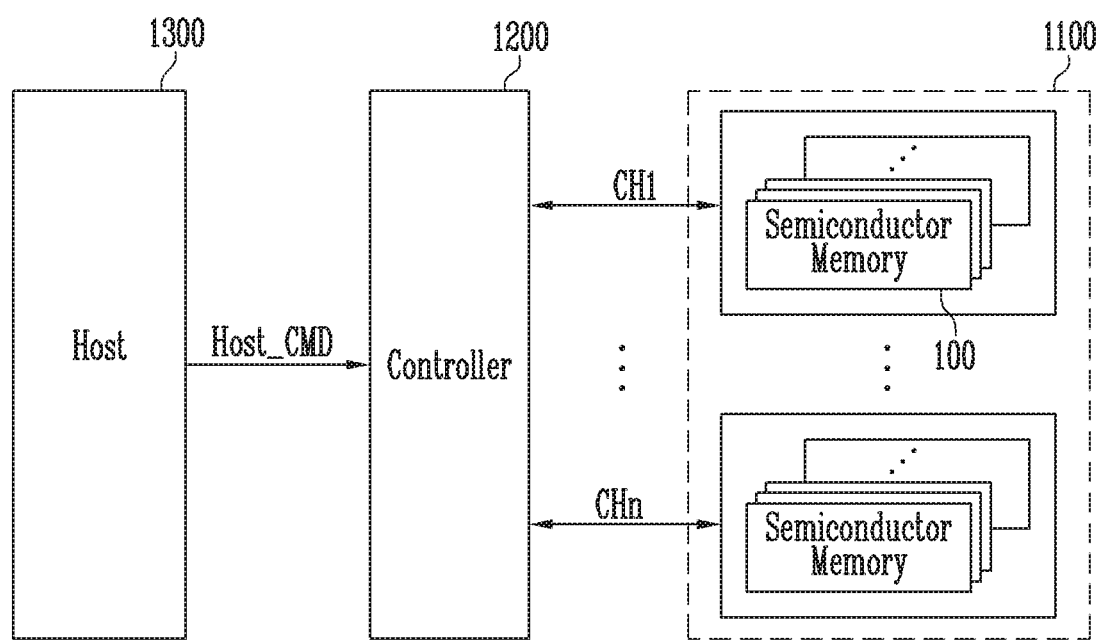
FIG. 1 is a block diagram illustrating a memory system in accordance with an embodiment of the present disclosure.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be variously modified and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~, between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description will be omitted for techniques that are well known to the art to which the present disclosure pertains, and are not directly related to the present disclosure. This intends to disclose the gist of the present disclosure more clearly by omitting unnecessary description.

Hereinafter, exemplary embodiments of the present disclosure will be described in detail with reference to the accompanying drawings in order for those skilled in the art to be able to readily implement the technical spirit of the present disclosure.

FIG. 1 is a block diagram illustrating a memory system in accordance with an embodiment of the present disclosure.

Referring to FIG. 1, the memory system 1000 includes a memory device 1100, a controller 1200, and a host 1300. The memory device 1100 includes a plurality of semiconductor memories 100. The plurality of semiconductor memories 100 may be divided into a plurality of groups. A case where the host 1300 is included in the memory system 1000 is illustrated and described in the embodiment of the present disclosure. Alternatively, the memory system 1000 may include only the controller 1200 and the memory device 1100, and the host 1300 may be disposed at the outside of the memory system 1000.

The plurality of groups of the memory device 1100 communicate with the controller 1200 respectively through first to nth channels CH1 to CHn. Each semiconductor memory 100 will be described later with reference to FIG. 4.

Each of the plurality of groups configured with the semiconductor memories 100 communicates with the controller 1200 through one common channel. The controller 1200 controls the plurality of semiconductor memories 100 of the memory device 1100 through the plurality of channels CH1 to CHn.

The controller 1200 is coupled between the host 1300 and the memory device 1100. The controller 1200 accesses the memory device 1100 in response to a request from the host 1300. For example, the controller 1200 controls read, write, erase, and background operations of the memory device 1100 in response to a host command Host_CMD received from the host 1300. In the write operation, the host 1300 may transmit data and an address together with the host command Host_CMD. In the read operation, the host 1300 may transmit an address together with the host command Host_CMD. The controller 1200 provides an interface between the memory device 1100 and the host 1300. The controller 1200 drives firmware for controlling the memory device 1100.

In a power-on operation, when a read request is received from the host 1300, or after a set time elapses from when a read operation is performed, the controller 1200 may perform a read voltage setting operation. In the read voltage setting operation, the controller 1200 may set a read retry range by checking an error correction circuit included in the controller 1200, perform a read operation by setting one voltage within the set read retry range as a read voltage, and reset the read retry range when the number of error bits, as a result of the performed read operation, is greater than a set of error bits.

The host 1300 includes portable electronic devices such as a computer, a PDA, a PMP, an MP3 player, a camera, a camcorder, and a mobile phone. The host 1300 may request a write operation, a read operation, and an erase operation of the memory system 1000 through a host command Host_CMD. In order to perform a write operation of the memory device 1100, the host 1300 may transmit, to the controller 1200, a host command Host_CMD data and an address, which correspond to a write command. In order to perform a read operation of the memory device 1100, the host 1300 may transmit, to the controller 1200, a host command Host_CMD and an address, which correspond to a read command. The address may be a logical address.

The controller 1200 and the memory device 1100 may be integrated into one semiconductor device. In an exemplary embodiment, the controller 1200 and the memory device 1100 may be integrated into one semiconductor device, to constitute a memory card. For example, the controller 1200 and the memory device 1100 may be integrated into one semiconductor device, to constitute a memory card such as a personal computer (PC) card (e.g., a Personal Computer Memory Card International Association (PCMCIA) card), a Compact Flash (CF) card, a Smart Media Card (e.g., SM or SMC), a memory stick, a Multi-Media Card (e.g., MMC, RS-MMC or MMCmicro), a secure digital (SD) card (e.g., SD, miniSD, microSD or SDHC), or a Universal Flash Storage (UFS).

The controller 1200 and the memory device 1100 may be integrated into one semiconductor device to constitute a semiconductor drive (e.g., solid state drive (SSD)). The semiconductor drive includes a storage device configured to store data in a semiconductor memory.

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the memory device 1100 or the memory system 1000 may be packaged in various forms. For example, the memory device 1100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 2:
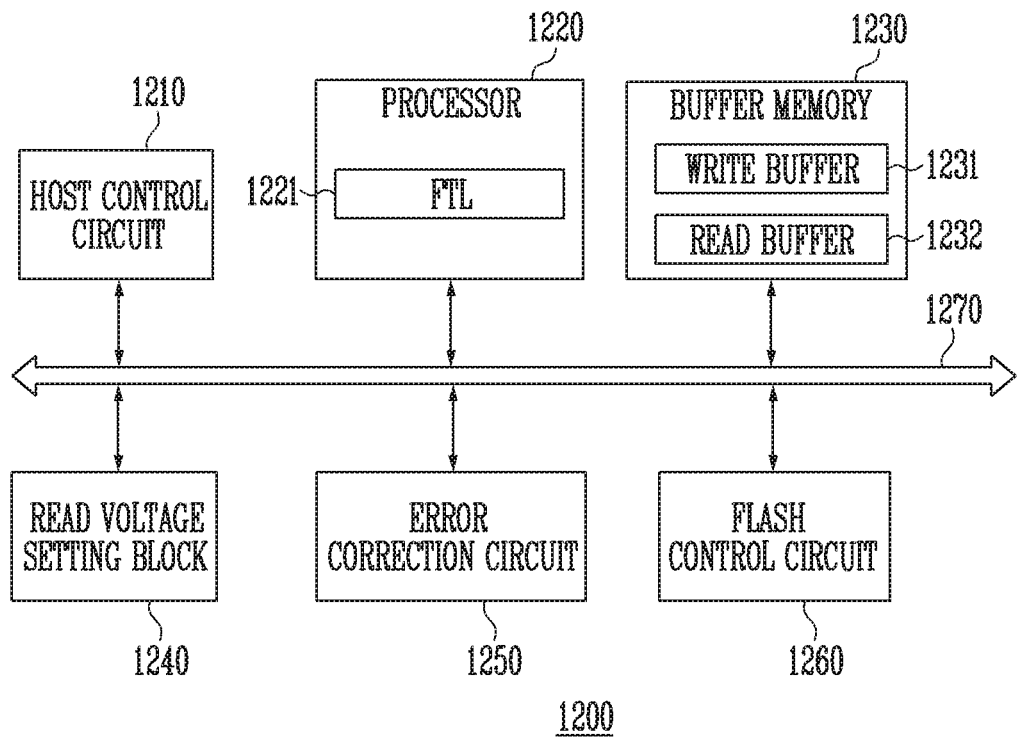
FIG. 2 is a block diagram illustrating a controller in accordance with an embodiment of the present disclosure.

FIG. 2 is a block diagram illustrating a controller in accordance with an embodiment of the present disclosure, for example, the controller 1200 shown in FIG. 1.

Referring to FIG. 2, the controller 1200 may include a host control circuit 1210, a processor 1220, a buffer memory 1230, a read voltage setting block 1240, an error correction circuit 1250, a flash control circuit 1260, and a bus 1270.

The bus 1270 may provide a channel between components of the controller 1200.

The host control circuit 1210 may control data transmission between a host (e.g., the host 1300 of FIG. 1) and the buffer memory 1230. In an example, the host control circuit 1210 may control an operation of buffering data input from the host 1300 to the buffer memory 1230. In another example, the host control circuit 1210 may control an operation of outputting the data buffered in the buffer memory 1230 to the host 1300.

The host control circuit 1210 may include a host interface.

The processor 1220 may control the overall operations of the controller 1200, and perform a logical operation. The processor 1220 may communicate with the host 1300 through the host control circuit 1210, and communicate with a memory device (e.g., the memory device 1100 of FIG. 1) through the flash control circuit 1260. The processor 1220 may control an operation of a memory system (e.g., the memory system 1000 of FIG. 1) by using the buffer memory 1230 as a working memory, cache memory or buffer memory. The processor 1220 may control the flash control circuit 1260 by generating a command queue by realigning a plurality of host commands received from the host 1300 according to an order of priority. The processor 1220 may include a flash translation layer (FTL) 1221 and the read voltage setting block 1240.

The FTL 1221 controls overall operations of the memory system 1000 by driving firmware. The firmware may be stored in an additional memory (not shown) directly coupled to the buffer memory 1230 or a storage space in the processor 1220. In a write operation, the FTL 1221 may map a corresponding physical address to an address (e.g., a logical address), which is received from the host 1300. In a read operation, the FTL 1221 checks the physical address mapped to the logical address.

The FTL 1221 may generate a command queue for controlling the flash control circuit 1260 in response to a host command received from the host 1300.

The buffer memory 1230 may be used as a working memory, cache memory or data buffer memory of the processor 1220. The buffer memory 1230 may store codes and commands, which are executed by the processor 1220. The buffer memory 1230 may store data processed by the processor 1220.

The buffer memory 1230 may include a write buffer 1231 and a read buffer 1232. In a write operation, the write buffer 1231 temporarily stores data received from the host 1300 and then transmits the temporarily stored data to the memory device 1100 when an internal command corresponding to the write operation is transmitted to the memory device 1100. In a read operation, the read buffer 1232 temporarily stores data received from the memory device 1100 and then transmits the temporarily stored data to the host 1300.

The buffer memory 1230 may include a static RAM (SRAM) or dynamic RAM (DRAM).

In a read voltage setting operation, the read voltage setting block 1240 checks the error correction circuit 1250. Further, the read voltage setting block 1240 sets a read retry range according to the error bit processing capability of the checked error correction circuit 1250, and sets one voltage within the set read retry range as a read voltage, thereby performing a read operation. When the number of error bits included in data read by the read operation is greater than a set of error bits, the read voltage setting block 1240 may reset the read retry range, and the reset read retry range may be set narrower than a previous read retry range. In some embodiments, the read voltage setting block 1240 may be included in the processor 1220.

The error correction circuit 1250 may perform error correction. The error correction circuit 1250 may perform error correction code (ECC) encoding, based on data to be written to the memory device 1100 of FIG. 1 through the flash control circuit 1260. The ECC-encoded data may be transferred to the memory device 1100 through the flash control circuit 1260. The error correction circuit 1250 may perform ECC decoding on data received from the memory device 1100 through the flash control circuit 1260. The error correction circuit 1250 may be configured with one of a plurality of ECC circuits, and the plurality of ECC circuits may have different error correction capabilities. That is, the plurality of ECC circuits have different maximum error allowable bit numbers. The error correction circuit 1250 may detect and count error bits of data received from the memory device 1100 in a read operation, and transmit the counted error bit number to the processor 1220.

In an example, the error correction circuit 1250 may be included as an internal component of the flash control circuit 1260.

The flash control circuit 1260 generates and outputs an internal command for controlling the memory device 1100 in response to the command queue generated by the processor 1220. In a write operation, the flash control circuit 1260 may control the write operation by transmitting data buffered in the write buffer 1231 to the memory device 1100. In a read operation, the flash control circuit 1260 may control an operation of buffering data read from the memory device 1100 to the read buffer 1232 in response to a command queue.

The flash control circuit 1260 may include a flash interface.

Figure 3:
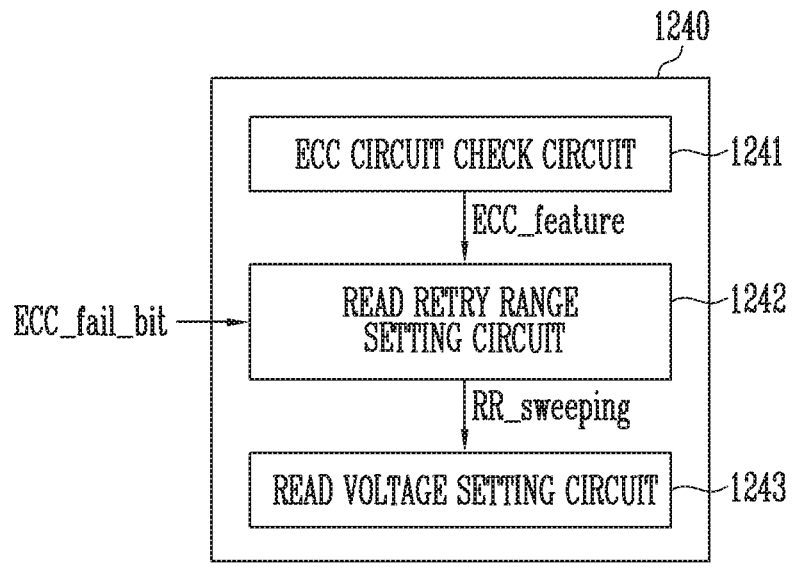
FIG. 3 is a block diagram illustrating a read voltage setting block in accordance with an embodiment of the present disclosure.

FIG. 3 is a block diagram illustrating a read voltage setting block in accordance with an embodiment of the present disclosure, for example, the read voltage setting block 1240 shown in FIG. 2.

Referring to FIG. 3, the read voltage setting block 1240 may include an error correction code (ECC) circuit check circuit 1241, a read retry range setting circuit 1242, and a read voltage setting circuit 1243.

The ECC circuit check circuit 1241 generates and outputs an ECC check signal ECC_feature by checking a type of ECC circuit. In other words, the ECC circuit check circuit 1241 checks which ECC circuit the error correction circuit 1250 of FIG. 2 is configured with. The ECC check signal ECC_feature may include information on an ECC circuit constituting the error correction circuit 1250 and information on the error correction capability of the ECC circuit.

The read retry range setting circuit 1242 sets a read retry range in response to the ECC check signal ECC_feature received from the ECC circuit check circuit 1241. The read retry range setting circuit 1242 may set a new read retry range, based on an error bit number ECC_fail_bit counted by the error correction circuit 1250 of FIG. 2 in a read operation. When the error bit number ECC_fail_bit is greater than a set error bit number, the read retry range setting circuit 1242 may set a new read retry range. The new read retry range may be included in a previous read retry range, and have a width narrower than the previous read retry range.

The read voltage setting circuit 1243 sets a read voltage used in a read operation in response to a read retry range signal RR_sweeping, which is output from the read retry range setting circuit 1242. For example, the read voltage setting circuit 1243 sets, as a read voltage, one voltage within the read retry range set by the read retry range setting circuit 1240. The read voltage may be a median value of the read retry range.

Figure 4:
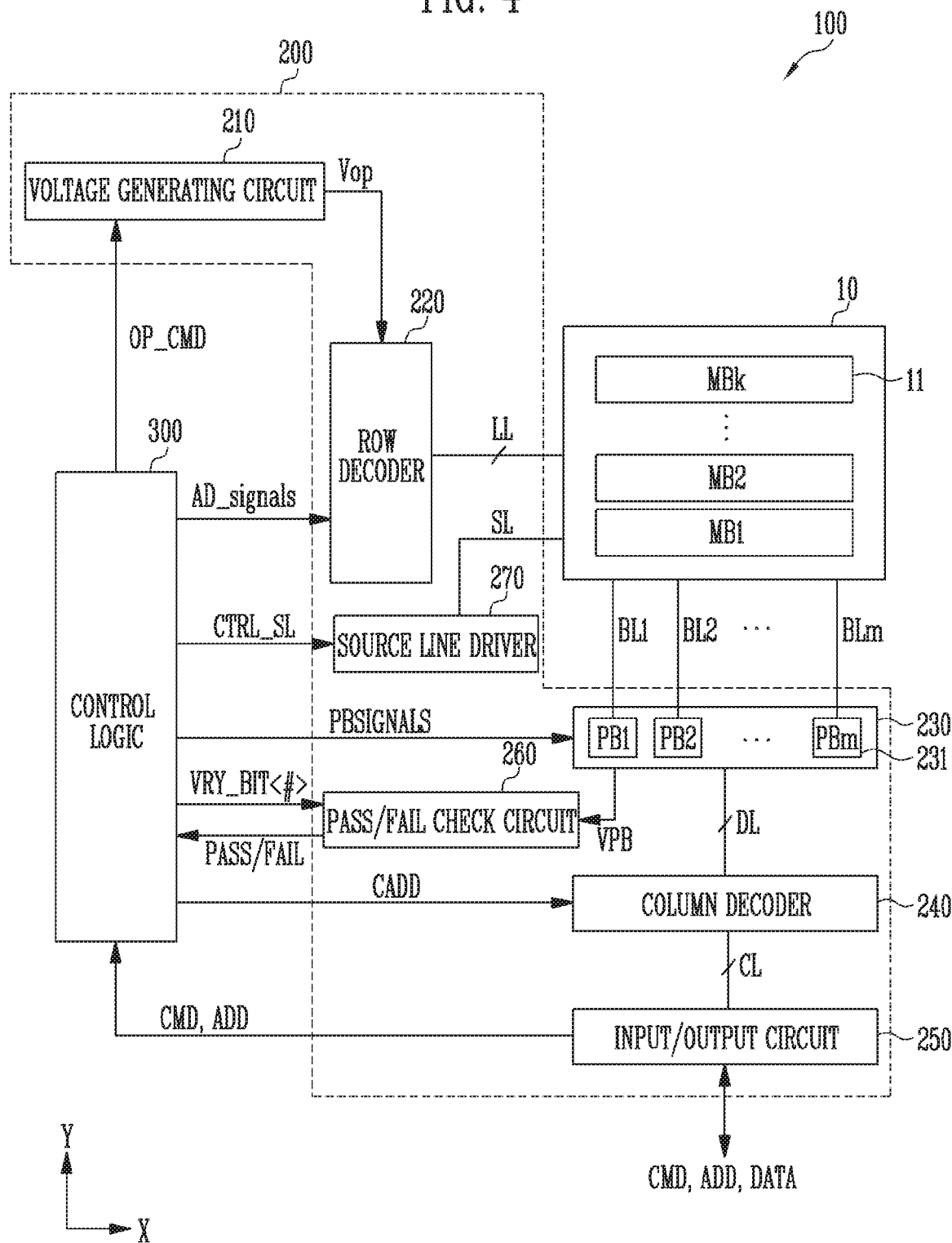
FIG. 4 is a diagram illustrating a semiconductor memory in accordance with an embodiment of the present disclosure.

FIG. 4 is a diagram illustrating a semiconductor memory in accordance with an embodiment of the present disclosure, for example, the semiconductor memory 100 shown in FIG. 1.

Referring to FIG. 4, the semiconductor memory 100 may include a memory cell array 10 for storing data. The semiconductor memory 100 may include a peripheral circuit 200 configured to perform a program operation for storing data in the memory cell array 10, a read operation for outputting the stored data, and an erase operation for erasing the stored data. The semiconductor memory 100 may include a control logic 300 that controls the peripheral circuit 200 under the control of a controller (e.g., the controller 1200 shown in FIG. 1).

The memory cell array 10 may include a plurality of memory blocks MB1 to MBk including a memory block MBk (where k is a positive integer). Local lines LL and bit lines BL1 to BLm (where m is a positive integer) may be coupled to the memory blocks MB1 to MBk 11. For example, the local lines LL may include a first select line, a second select line, and a plurality of word lines arranged between the first and second select lines. The local lines LL may further include dummy lines arranged between the first select line and the word lines, and between the second select line and the word lines. The first select line may be a source select line, and the second select line may be a drain select line. For example, the local lines LL may include word lines, drain and source select lines, and source lines SL. The local lines LL may further include dummy lines. The local lines LL may further include pipe lines. The local lines LL may be coupled to the memory blocks MB1 to MBk 11, respectively. The bit lines BL1 to BLm may be commonly coupled to the memory blocks MB1 to MBk 11. The memory blocks MB1 to MBk 11 may be implemented in a two-dimensional or three-dimensional structure. For memory blocks 11 having a two-dimensional structure, memory cells may be arranged in a direction parallel to a substrate. For memory blocks 11 having a three-dimensional structure, memory cells may be arranged in a direction vertical to a substrate.

The peripheral circuit 200 may be configured to perform program, read, and erase operations of a selected memory block 11 under the control of the control logic 300. For example, the peripheral circuit 200 may include a voltage generating circuit 210, a row decoder 220, a page buffer group 230, a column decoder 240, an input and output (input/output) circuit 250, a pass/fail (pass/fail) check circuit 260, and a source line driver 270.

The voltage generating circuit 210 may generate various operating voltages Vop used for program, read, and erase operations in response to an operation signal OP_CMD. The voltage generating circuit 210 may selectively discharge the local lines LL in response to the operation signal OP_CMD. For example, the voltage generating circuit 210 may generate a program voltage, a verify voltage, a pass voltage, and a select transistor operation voltage under the control of the control logic 300.

The row decoder 220 may transfer the operating voltages Vop to local lines LL coupled to the selected memory block 11 in response to control signals AD_signals. For example, the row decoder 220 may selectively apply operating voltages (e.g., a program voltage, a verify voltage, and a pass voltage) to word lines among the local lines LL in response to the control signals AD_signals.

In a program voltage applying operation, the row decoder 220 applies a program voltage to a selected word line among the local lines LL in response to the control signals AD_signals, and applies a pass voltage to other unselected word lines. In a read operation, the row decoder 220 applies a read voltage to a selected word line among the logical lines LL in response to the control signals AD_signals, and applies a pass voltage to other unselected word lines.

The page buffer group 230 may include a plurality of page buffers PB1 to PBm 231 coupled to the bit lines BL1 to BLm. The page buffers PB1 to PBm 231 may operate in response to page buffer control signals PBSIGNALS. In a program operation, the page buffers PB1 to PBm 231 may temporarily store data to be programmed. In a read or verify operation, the page buffers PB1 to PBm 231 may sense voltages or currents of the bit lines BL1 to BLm.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and an address ADD, which are received from the controller 1200 of FIG. 1, to the control logic 300, or exchange data DATA with the column decoder 240.

In a read operation, the pass/fail check circuit 260 may generate a reference current in response to a allow bit VRY_BIT<#>. Further, the pass/fail check circuit 260 may output a pass signal PASS or a fail signal FAIL by comparing a sensing voltage VPB received from the page buffer group 230 with a reference voltage generated by the reference current.

The source line driver 270 may be coupled to a memory cell included in the memory cell array 10 through a source line SL, and control a voltage applied to the source line SL. The source line driver 270 may receive a source line control signal CTRL_SL from the control logic 300, and control a source line voltage applied to the source line SL, based on the source line control signal CTRL_SL.

The control logic 300 may control the peripheral circuit 200 by outputting the operation signal OP_CMD, the control signals AD_signals, the page buffer control signals PBSIGNALS, and the allow bit VRY_BIT<#> in response to the command CMD and the address ADD. Also, the control logic 300 may determine whether the verify operation has passed or failed in response to the pass or fail signal PASS or FAIL.

Figure 5:
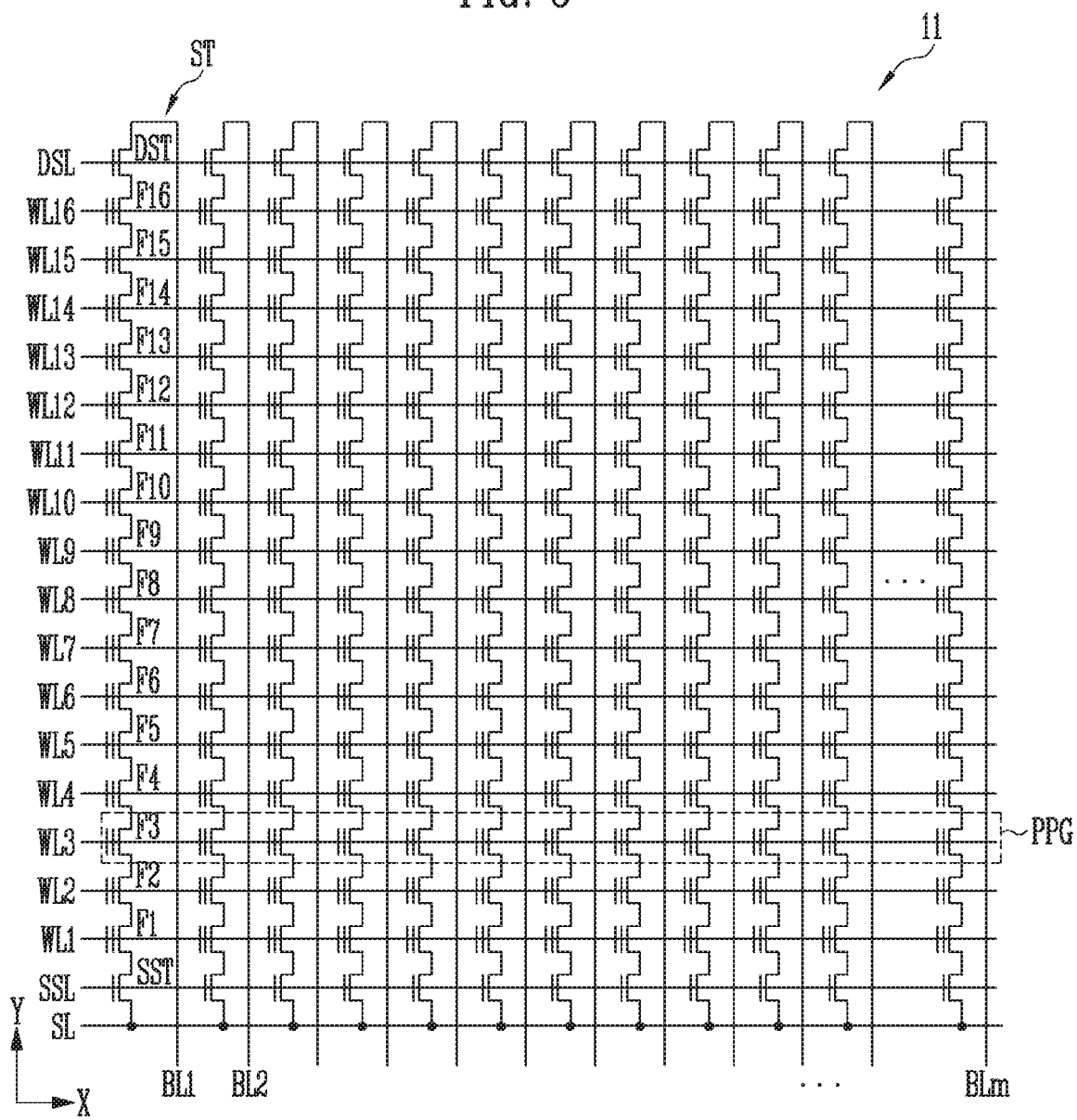
FIG. 5 is a diagram illustrating a memory block in accordance with an embodiment of the present disclosure.

FIG. 5 is a diagram illustrating a memory block in accordance with an embodiment of the present disclosure, for example, the memory block 11 shown in FIG. 4.

Referring to FIG. 5, in the memory block 11, a plurality of word lines arranged in parallel to one another may be coupled between a first select line and a second select line. The first select line may be a source select line SSL, and the second select line may be a drain select line DSL. More specifically, the memory block 11 may include a plurality of strings ST coupled between bit lines BL1 to BLm and a source line SL. The bit lines BL1 to BLm may be coupled to the strings ST, respectively. The source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. The string ST may include at least one source select transistor SST and at least one drain select transistor DST. The string ST may include memory cells of which a number is greater than that of the memory cells F1 to F16.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST in different strings ST may be coupled to the source select line SSL. Gates of drain select transistors DST in different strings ST may be coupled to the drain select line DSL. Gates of the memory cells F1 to F16 in different strings ST may be coupled to a plurality of word lines WL1 to WL16. A group of memory cells coupled to the same word line among the memory cells in different strings ST may be a physical page PPG. Therefore, the memory block 11 may include a number of physical pages PPG that corresponds to the word lines WL1 to WL16.

One memory cell may store data of one bit. The one memory cell is generally referred to as a single level cell (SLC). One physical page PPG may store one logical page (LPG) data. The one LPG data may include data bits corresponding to the number of cells in one physical page PPG. Also, one memory cell may store data of two or more bits. The one memory cell is generally referred to as a multi-level cell (MLC). One physical page PPG may store two or more LPG data.

Figure 6:
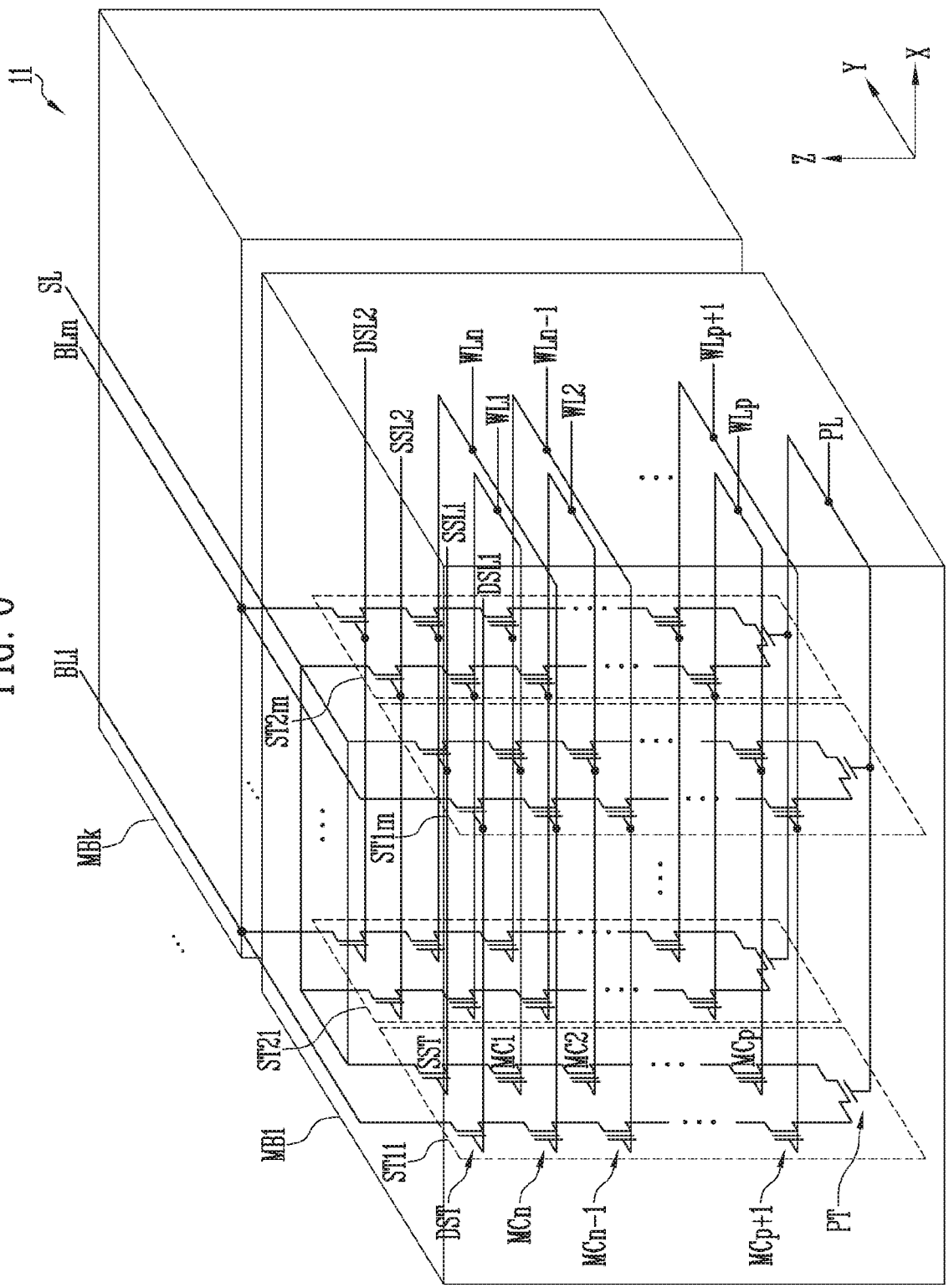
FIG. 6 is a diagram illustrating an example of a three-dimensionally configured memory block.

FIG. 6 is a diagram illustrating an example of a three-dimensionally configured memory block 11 of the memory cell array 10.

Referring to FIG. 6, the memory cell array 10 may include memory blocks MB1 to MBk including the memory block 11. The memory block 11 may include a plurality of strings ST11 to ST1*m* and ST21 to ST2*m*. In an embodiment, each of the plurality of strings ST11 to ST1*m* and ST21 to ST2*m* may be formed in a 'U' shape. In the memory block 11, m strings may be arranged in a row direction (e.g., X direction). Although FIG. 6 illustrates a case where two strings are arranged in a column direction (e.g., Y direction), three or more strings may be arranged in the column direction (e.g., Y direction).

Each of the plurality of strings ST11 to ST1*m* and ST21 to ST2*m* may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. Each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For another example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 6, source select transistors of strings ST11 to ST1m of a first row may be coupled to a first source select line SSL1. Source select transistors of strings ST21 to ST2m of a second row may be coupled to a second source select line SSL2.

In another embodiment, the source select transistors of the strings ST11 to ST1m and ST21 to ST2m may be commonly coupled to one source select line.

First to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (e.g., Z direction), and be coupled in series to each other between the source select transistor SST and the pipe transistor PT. The (p+1)th to nth memory cells MCp+1 to MCn may be sequentially arranged in the vertical direction (e.g., Z direction), and be coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be coupled to a pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1nn of the first row may be coupled to a first drain select line DSL1. Drain select transistors of the strings ST21 to ST2m of the second row may be coupled to a second drain select line DSL2.

Strings arranged in the column direction may be coupled to bit lines extending in the column direction. In FIG. 6, strings ST11 and ST21 of a first column may be coupled to a first bit line BL1. Strings ST1nn and ST2m of an mth column may be coupled to an mth bit line BLm.

Memory cells coupled to the same word line among the strings arranged in the row direction may constitute one page. For example, memory cells coupled to the first word line WL1 among the strings ST11 to ST1m of the first row may constitute one page. Memory cells coupled to the first word line WL1 among the strings ST21 to ST2m of the second row may constitute another page. When any one of the drain select lines DSL1 and DSL2 is selected, strings arranged in one row direction may be selected. When any one of the word lines WL1 to WLn is selected, one page among the selected strings may be selected.

Figure 7:
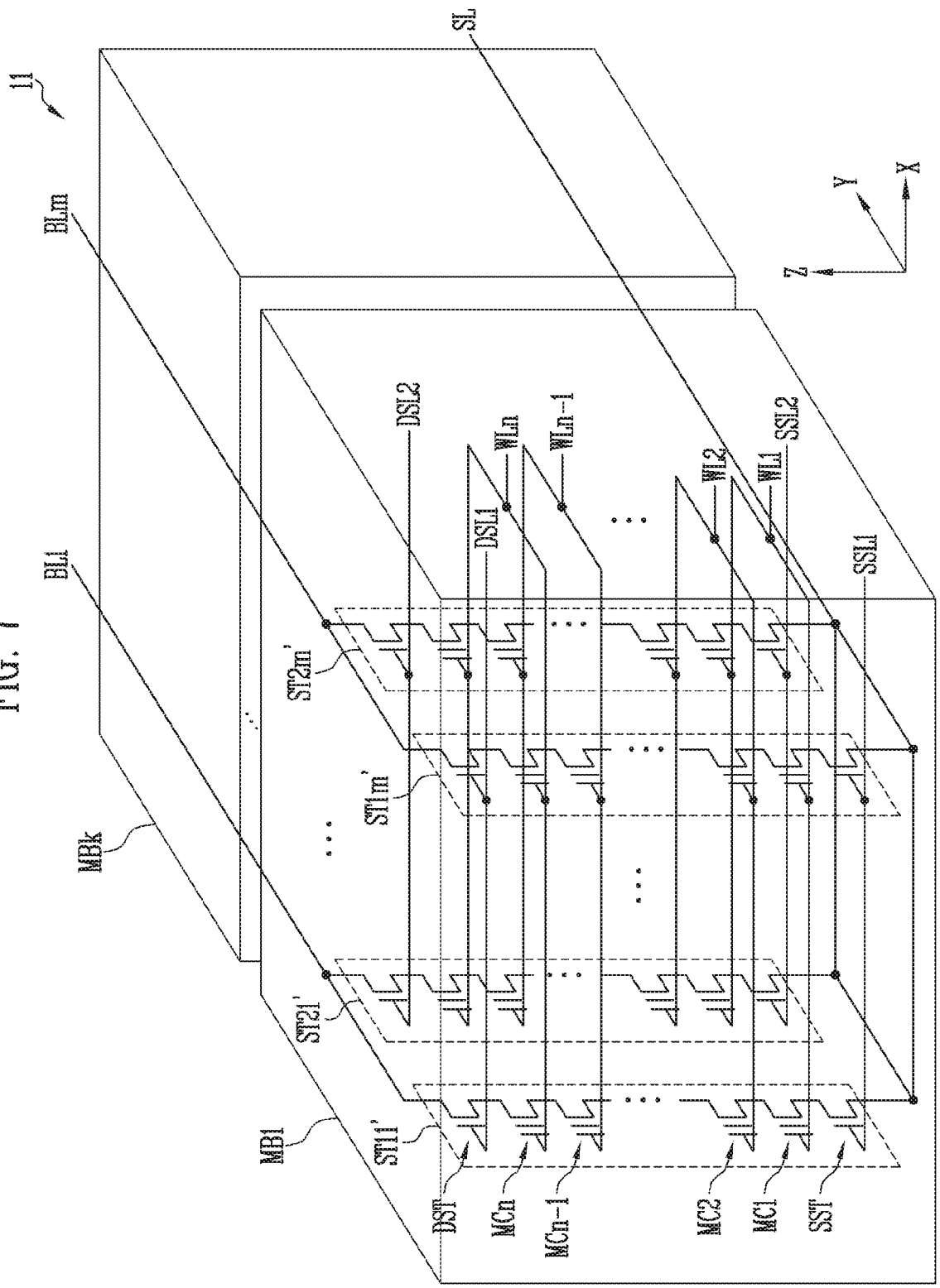
FIG. 7 is a diagram illustrating another example of the three-dimensionally configured memory block.

FIG. 7 is a diagram illustrating another example of the three-dimensionally configured memory block 11 in the memory cell array 10.

Referring to FIG. 7, the memory cell array 10 may include a plurality of memory blocks MB1 to MBk 11 including the memory block 11. The memory block 11 may include a plurality of strings ST11' to ST1m' and ST21' to ST2m'. Each of the plurality of strings ST11' to ST1m' and ST21' to ST2m' may extend along a vertical direction (e.g., Z direction). In the memory block 11, m strings may be arranged in a row direction (e.g., X direction). Although FIG. 7 illustrates a case where two strings are arranged in a column direction (e.g., Y direction), three or more strings may be arranged in the column direction (e.g., Y direction).

Each of the plurality of strings ST11' to ST1m' and ST21' to ST2m' may include at least one source select transistor SST, first to nth memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. Source select transistors of strings ST11' to ST1m' arranged on a first row may be coupled to a first source select line SSL1. Source select transistors of strings ST21' to ST2m' arranged on a second row may be coupled to a second source select line SSL2. In another embodiment, the source select transistors of the strings ST11' to ST1m' and ST21' to ST2m' may be commonly coupled to one source select line.

The first to nth memory cells MC1 to MCn of each string may be coupled in series to each other between the source select transistor SST and the drain select transistor DST. Gates of the first to nth memory cells MC1 to MCn may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. Accordingly, the reliability of data stored in the memory block 11 can be improved.

The drain select transistor DST of each string may be coupled between a bit line and the memory cells MC1 to MCn. Drain select transistors DST of strings arranged in the row direction may be coupled to a drain select line extending in the row direction. The drain select transistors DST of the strings ST11' to ST1m' of the first row may be coupled to a first drain select line DSL1. The drain select transistors DST of the strings ST21' to ST2m' of the second row may be coupled to a second drain select line DSL2.

Figure 8:
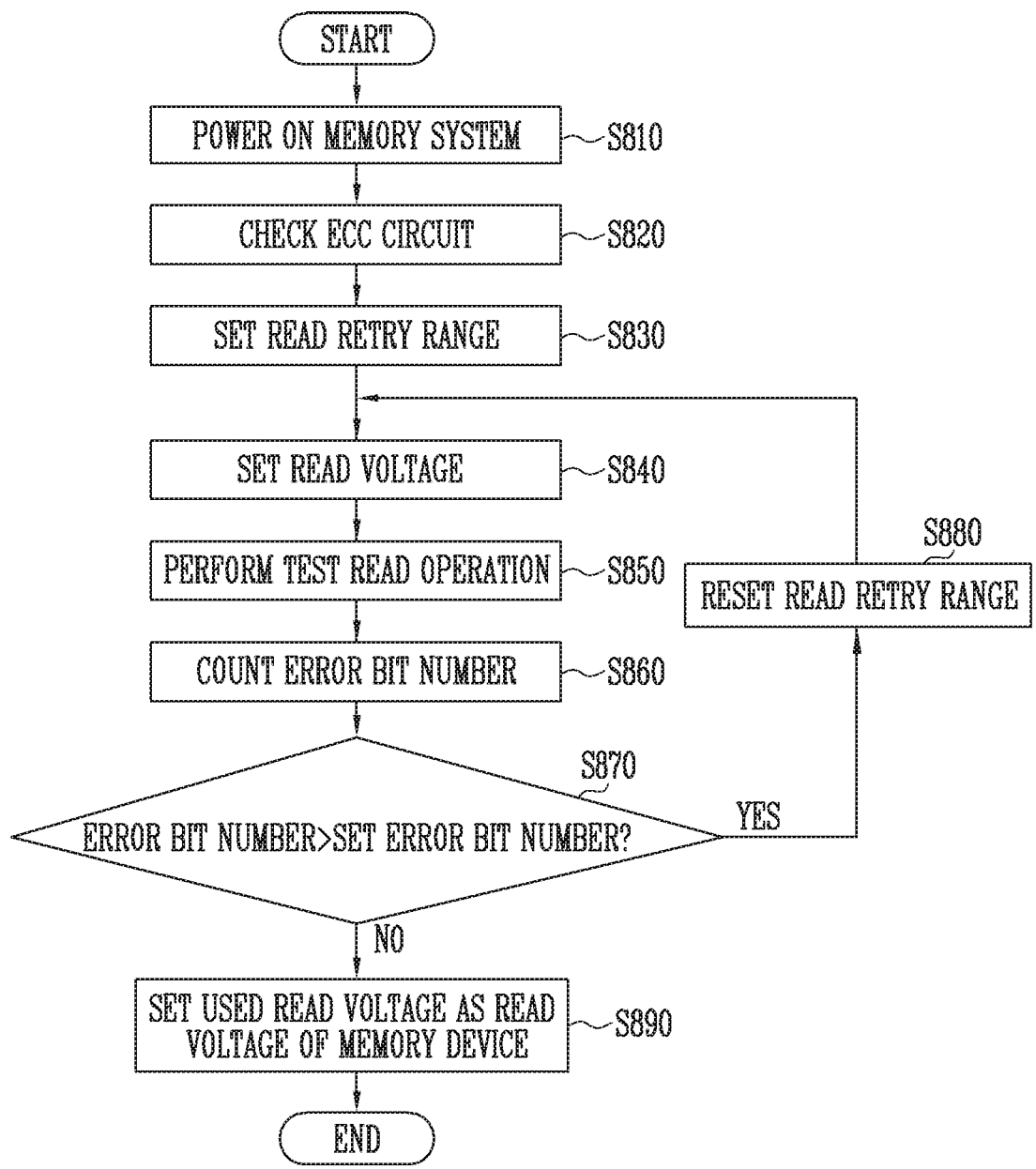
FIG. 8 is a flowchart illustrating an operation of a memory system in accordance with an embodiment of the present disclosure.

FIG. 8 is a flowchart illustrating an operation of a memory system in accordance with an embodiment of the present disclosure, for example, the memory system 1000 of FIG. 1.

Figure 9:
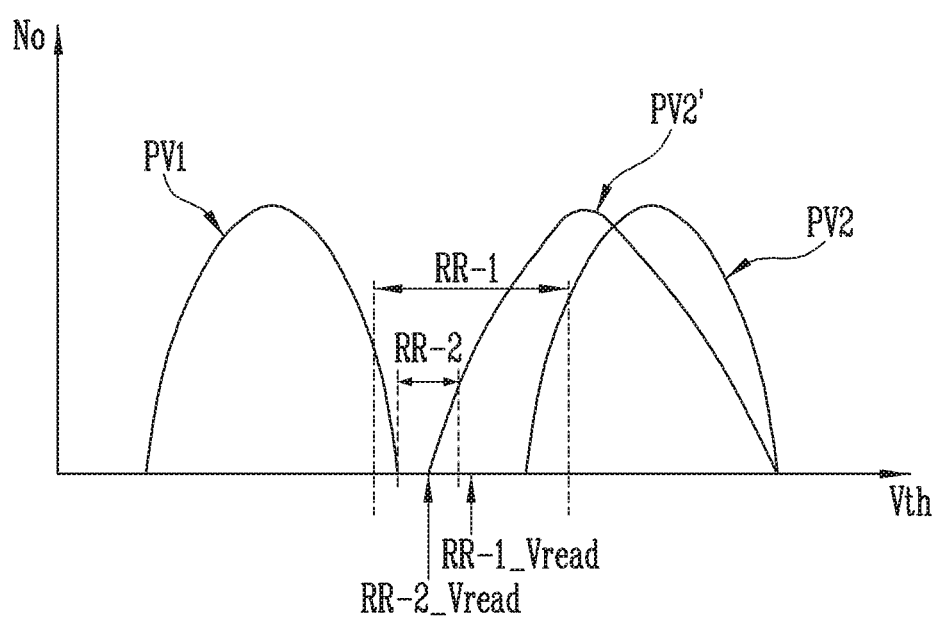
FIG. 9 is a diagram illustrating a read retry range of a memory system in accordance with an embodiment of the present disclosure.

FIG. 9 is a diagram illustrating a read retry range of a memory system in accordance with an embodiment of the present disclosure, for example, the memory system 1000 of FIG. 1.

An operating method of the memory system 1000 will be described as follows with reference to FIGS. 1 to 9.

Referring to FIG. 8, when the memory system 1000 is power-on (S810), the read voltage setting block 1240 checks a type of an ECC circuit, with which the error correction circuit 1250 is configured (S820). For example, the ECC circuit check circuit 1241 of the read voltage setting block 1240 checks the type of the ECC circuit by checking the error correction circuit 1250 in the controller 1200, and generates and outputs an ECC check signal ECC_feature based on the checking result.

The read retry range setting circuit 1242 sets a read retry range RR-1 of FIG. 9, based on the received ECC check signal ECC_feature (S830). That is, the read retry range setting circuit 1242 checks a type of ECC circuit of the error correction circuit 1250, based on the ECC check signal ECC_feature, and sets the read retry range RR-1 according to an error correction capability of the checked ECC circuit. When the memory cells of the memory device 1100 are programmed to a first program state PV1 and a second program state PV2, the read retry range RR-1 ranges from a minimum read voltage to a maximum read voltage to distinguish the first program state PV1 and the second program state PV2 from each other. Further, the read retry range RR-1 may be set such that an error bit number occurring in a read operation using the minimum read voltage, and an error bit number occurring in a read operation using the maximum read voltage are less than a maximum error allowable bit number of the error correction circuit 1250.

The read voltage setting circuit 1243 sets one read voltage RR-1_Vread within the read retry range RR-1, which is set by the read retry range setting circuit 1242 (S840). The read voltage RR-1_Vread may be a median value of the read retry range RR-1.

The processor 1220 generates a command queue corresponding to a test read operation. The flash control circuit 1260 generates an internal command CMD for the test read operation in response to the command queue and then outputs the generated internal command CMD to the memory device 1100. The flash control circuit 1260 also outputs information on the read voltage, which is set by the read voltage setting circuit 1243, to the memory device 1100.

The memory device 1100 performs the test read operation in response to the internal command CMD received from the controller 1200. The test read operation is performed using a read voltage set by the controller 1200 (S850). For example, one semiconductor memory among the plurality of semiconductor memories 100 in the memory device 1100 is selected, and the test read operation on at least one physical page PPG is performed by selecting one memory block (e.g., MB1) among the plurality of memory blocks 11 in the selected semiconductor memory.

The flash control circuit 1260 transmits data read as a result obtained by performing the test read operation to the error correction circuit 1250 of the controller 1200. The error correction circuit 1250 counts an error bit number by detecting error bits of the received data (S860).

The read retry range setting circuit 1242 compares the error bit number ECC_fail_bit, which is counted by the error correction circuit 1250, with a set error bit number (S870). For example, the set error bit number may be less than the maximum error allowable bit number of the error correction circuit 1250.

The threshold voltage distribution of memory cells in the memory device 1100 may be degraded according to a retention characteristic. For example, as shown in FIG. 9, a threshold voltage distribution of the second program state PV2 may be changed to a threshold voltage distribution PV2' as shown in FIG. 9 due to threshold voltage distribution degradation. When the threshold voltage is degraded from PV2 to PV2', the error bit number may be increased in the read operation using the read voltage RR-1_Vread. That is, when the threshold voltage distribution of the memory cells is normal, the error bit number ECC_fail_bit may be less than or equal to the set error bit number. When the threshold voltage distribution of the memory cells is degraded, the error bit number ECC_fail_bit may be greater than the set error bit number.

At the step S870, the counted error bit number ECC_fail_bit is compared with the set error bit number. When the error bit number ECC_fail_bit is greater than the set error bit number (S870, Yes), the read retry range setting circuit 1242 sets a new read retry range RR-2 (S880). In other words, the read retry range setting circuit 1242 resets the read retry range RR-1. The new read retry range RR-2 may be included in the previous read retry range RR-1, and have a width narrower than that of the previous read retry range RR-1.

Subsequently, the above-described steps are re-performed from the step S840. That is, the read voltage setting circuit 1243 re-performs the test read operation by setting one new read voltage RR-2_Vread within the new read retry range RR-2.

When the error bit number ECC_fail_bit is less than or equal to the set error bit number (S870, No), the read retry range setting circuit 1242 sets a read voltage used in a previous test read operation as the read voltage of the memory device 1100 (S890).

Subsequently, when a read operation is requested from the host 1300, the controller 1200 may control the memory device 1100 to perform the read operation using the set read voltage. When a certain time elapses from when the read voltage is set, the threshold voltage distribution of the memory cells in the memory device 1100 may be further degraded. Therefore, a new read voltage may be set by re-performing the above-described steps S830 to S890.

In accordance with the above-described embodiment, a read voltage corresponding to an error bit number less than the maximum error allow bit number of the error correction circuit 1250 may be rapidly set by checking an ECC circuit constituting the error correction circuit 1250, so that the latency of the memory system 1000 may be minimized.

Figure 10:
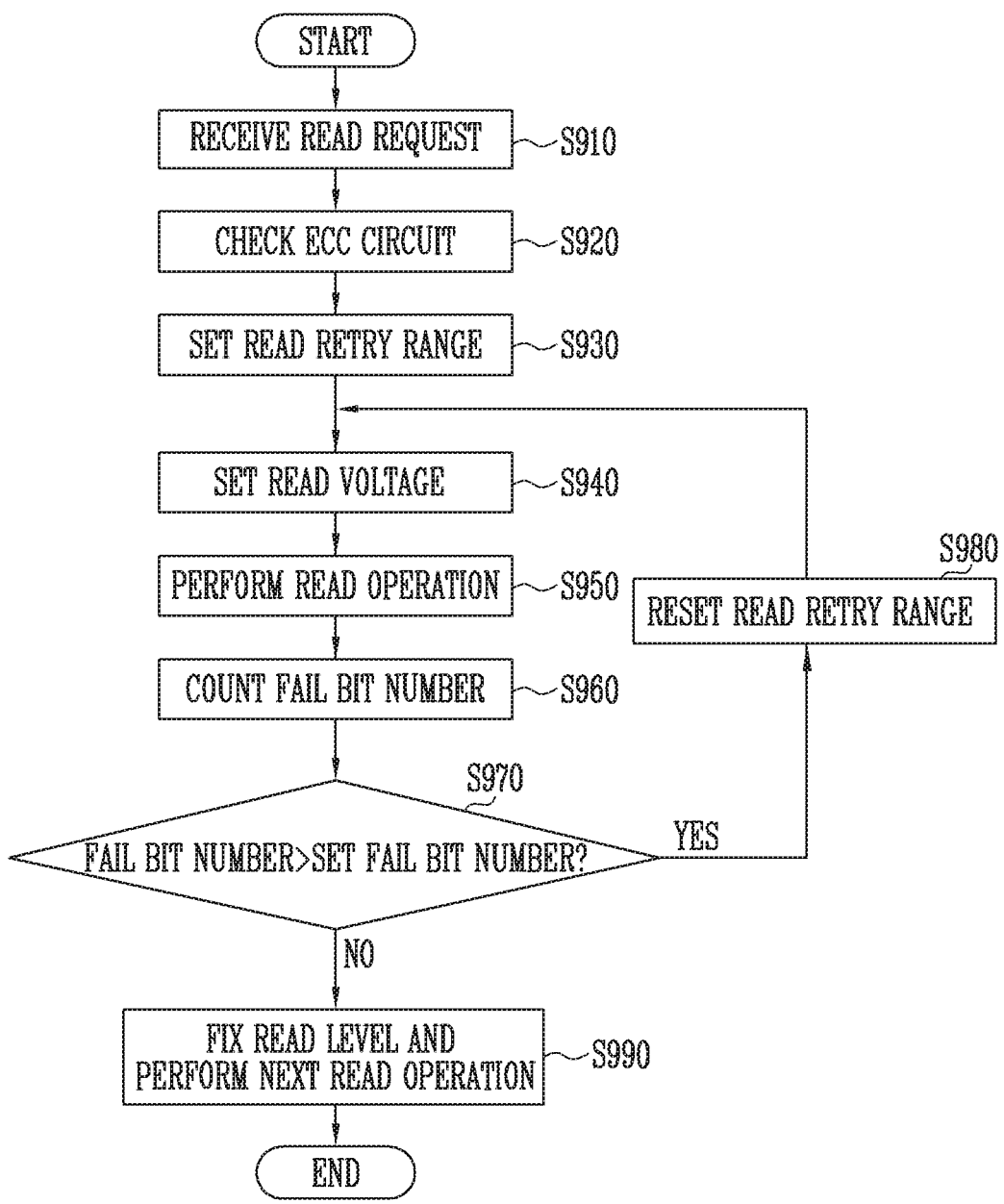
FIG. 10 is a flowchart illustrating an operation of a memory system in accordance with an embodiment of the present disclosure.

FIG. 10 is a flowchart illustrating an operation of a memory system in accordance with an embodiment of the present disclosure, for example, the memory system 1000 of FIG. 1.

An operating method of the memory system 1000 will be described as follows with reference to FIGS. 1 to 7, 9, and 10.

Referring to FIG. 10, when a host command Host_CMD corresponding to a read request is received from the host 1300 (S910), the processor 1220 of the controller 1200 generates a command queue by aligning the host command Host_CMD.

In addition, the read voltage setting block 1240 checks which type of an ECC circuit, the error correction circuit 1250 is configured with (S920). For example, the ECC circuit check circuit 1241 of the read voltage setting block 1240 checks the type of the ECC circuit by checking the error correction circuit 1250 in the controller 1200, and generates and outputs an ECC check signal ECC_feature based on the checking result.

The read retry range setting circuit 1242 sets a read retry range RR-1 of FIG. 9, based on the received ECC check signal ECC_feature (S930). That is, the read retry range setting circuit 1242 checks a type of ECC circuit of the error correction circuit 1250, based on the ECC check signal ECC_feature. Further, the read retry range setting circuit 1242 sets the read retry range RR-1 according to an error correction capability of the checked ECC circuit. When the memory cells of the memory device 1100 are programmed to a first program state PV1 and a second program state PV2, the read retry range RR-1 ranges from a minimum read voltage to a maximum read voltage to distinguish the first program state PV1 and the second program state PV2 from each other. Further, the read retry range RR-1 may be set such that an error bit number occurring in a read operation using the minimum read voltage and an error bit number occurring in a read operation using the maximum read voltage are less than a maximum error allowable bit number of the error correction circuit 1250.

The read voltage setting circuit 1243 sets one read voltage RR-1_Vread within the read retry range RR-1, which is set by the read retry range setting circuit 1242 (S940). The read voltage RR-1_Vread may be a median value of the read retry range RR-1.

The flash control circuit 1260 generates an internal command CMD for a read operation in response to the command queue. Then, the flash control circuit 1260 outputs the generated internal command CMD to the memory device 1100. The flash control circuit 1260 also outputs information on the read voltage set by the read voltage setting circuit 1243 to the memory device 1100.

The memory device 1100 performs the read operation in response to the internal command CMD received from the controller 1200. The read operation is performed using a read voltage set by the controller 1200 (S950). For example, one semiconductor memory among the plurality of semiconductor memories 100 in the memory device 1100 is selected, and the read operation on one physical page PPG or the read operation on at least two physical pages PPG is performed by selecting one memory block (e.g., MB1) among the plurality of memory blocks 11 in the selected semiconductor memory.

The flash control circuit 1260 transmits data read as a result obtained by performing the read operation to the error correction circuit 1250 of the controller 1200. The error correction circuit 1250 counts an error bit number by detecting error bits of the received data (S960).

The read retry range setting circuit 1242 compares the error bit number ECC_fail_bit, which is counted by the error correction circuit 1250, with a set error bit number (S970). For example, the set error bit number may be less than the maximum error allowable bit number of the error correction circuit 1250.

The threshold voltage distribution of memory cells in the memory device 1100 may be degraded according to a retention characteristic. For example, as shown in FIG. 9, a threshold voltage distribution of the second program state PV2 may be changed to a threshold voltage distribution PV2' as shown in FIG. 9 due to threshold voltage distribution degradation. When the threshold voltage is degraded from PV2 to PV2', the error bit number may be increased in the read operation using the read voltage RR-1_Vread. That is, when the threshold voltage distribution of the memory cells is normal, the error bit number ECC_fail_bit may be less than or equal to the set error bit number. When the threshold voltage distribution of the memory cells is degraded, the error bit number ECC_fail_bit may be greater than the set error bit number.

At the step S970, the counted error bit number ECC_fail_bit is compared with the set error bit number. When the error bit number ECC_fail_bit is greater than the set error bit number (S970, Yes), the read retry range setting circuit 1242 sets a new read retry range RR-2 (S980). In other words, the read retry range setting circuit 1242 resets the read retry range RR-1. The new read retry range RR-2 may be included in the previous read retry range RR-1, and have a width narrower than that of the previous read retry range RR-1.

Subsequently, the above-described steps are re-performed from the step S940. That is, the read voltage setting circuit 1243 re-performs the read operation on one physical page PPG of the selected memory block (e.g., MB1) or the read operation on at least two physical pages PPG of the selected memory block by setting one new read voltage RR-2_Vread within the new read retry range RR-2.

When the error bit number ECC_fail_bit is less than or equal to the set error bit number (S970, No), the read retry range setting circuit 1242 fixes a read voltage used in a previous read operation as the read voltage of the memory device 1100. Then, a read operation is performed on next physical pages PPG of the selected memory block (e.g., MB1) (S990).

In accordance with the above-described embodiment, when a read voltage corresponding to an error bit number less than the maximum error allowable bit number of the error correction circuit 1250 is detected, the read voltage may be rapidly set by checking an ECC circuit constituting the error correction circuit 1250, so that the latency of the memory system may be minimized.

Figure 11:
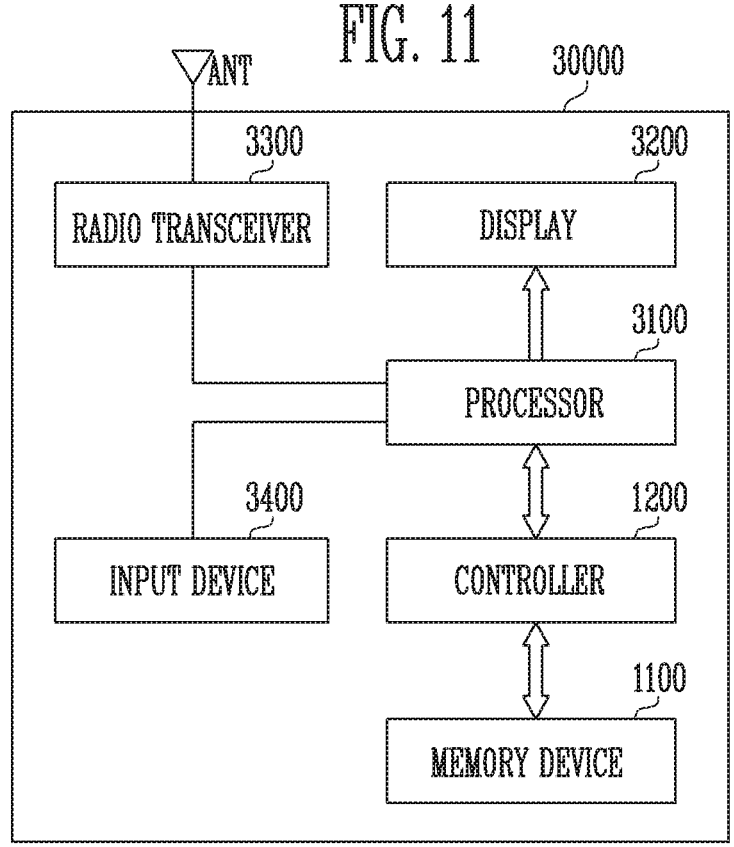
FIG. 11 is a diagram illustrating a memory system in accordance with an embodiment of the present disclosure.

FIG. 11 is a diagram illustrating a memory system 30000 in accordance with an embodiment of the present disclosure.

Referring to FIG. 11, the memory system 30000 may be implemented as a cellular phone, a smart phone, a tablet personal computer (PC), a personal digital assistant (PDA), or a wireless communication device. The memory system 30000 may include a memory device 1100 and a controller 1200 capable of controlling an operation of the memory device 1100. The controller 1200 may control a data access operation of the memory device 1100, e.g., a program operation, an erase operation, a read operation, or the like under the control of a processor 3100.

Data programmed in the memory device 1100 may be output through a display 3200 under the control of the controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 1200 or the display 3200. The controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad, a computer mount, a keypad, or a keyboard. The processor 3100 may control an operation of the display 3200 such that data output from the controller 1200, data output from the radio transceiver 3300, or data output from the input device 3400 can be output through the display 3200.

In some embodiments, the controller 1200 capable of controlling an operation of the memory device 1100 may be implemented as a part of the processor 3100, or be implemented as a chip separate from the processor 3100. Also, the controller 1200 may be implemented with the controller shown in FIG. 2.

Figure 12:
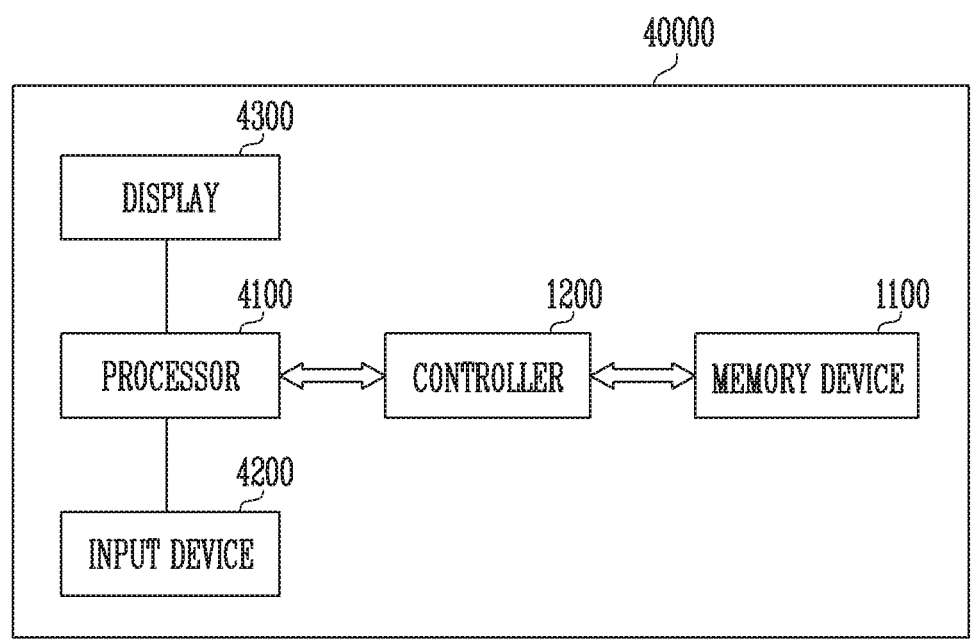
FIG. 12 is a diagram illustrating a memory system in accordance with an embodiment of the present disclosure.

FIG. 12 is a diagram illustrating a memory system 40000 in accordance with an embodiment of the present disclosure.

Referring to FIG. 12, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad, a computer mouse, a keypad, or a keyboard.

The processor 4100 may control overall operations of the memory system 40000, and control an operation of the controller 1200. In some embodiments, the controller 1200 capable of controlling an operation of the memory device 1100 may be implemented as a part of the processor 4100, or be implemented as a chip separate from the processor 4100. Also, the controller 1200 may be implemented with the controller shown in FIG. 2.

Figure 13:
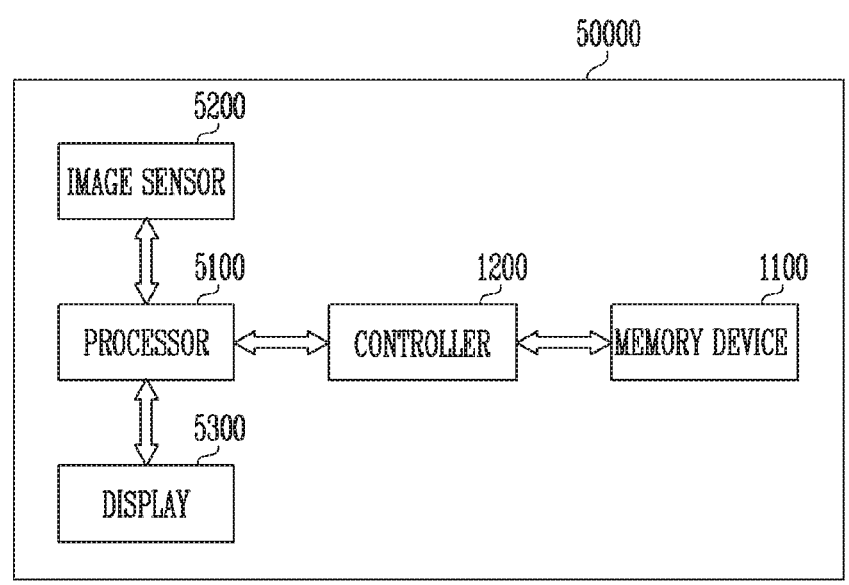
FIG. 13 is a diagram illustrating a memory system in accordance with an embodiment of the present disclosure.

FIG. 13 is a diagram illustrating a memory system 50000 in accordance with an embodiment of the present disclosure.

Referring to FIG. 13, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the controller 1200. Under the control of the processor 5100, the converted digital signals may be output through a display 5300, or be stored in the memory device 1100 through the controller 1200. In addition, data stored in the memory device 1100 may be output through the display 5300 under the control of the processor 5100 or the controller 1200.

In some embodiments, the controller 1200 capable of controlling an operation of the memory device 1100 may be implemented as a part of the processor 5100, or be implemented as a chip separate from the processor 5100. Also, the controller 1200 may be implemented with the controller shown in FIG. 2.

Figure 14:
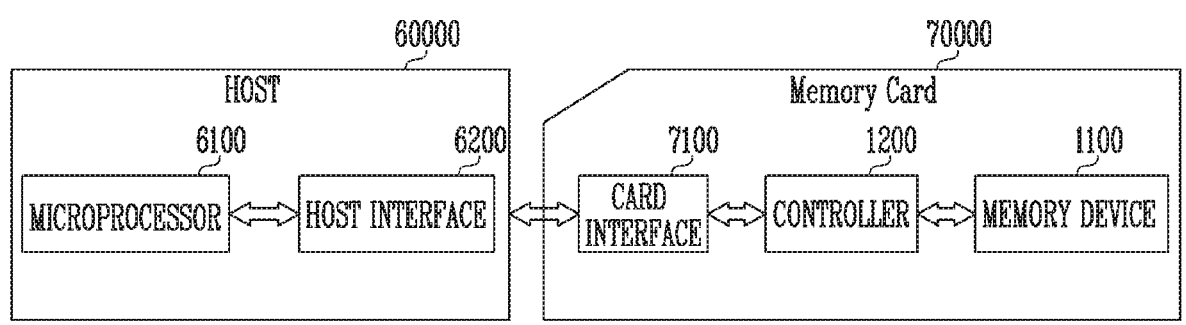
FIG. 14 is a diagram illustrating a memory system in accordance with an embodiment of the present disclosure.

FIG. 14 is a diagram illustrating a memory system 70000 in accordance with an embodiment of the present disclosure.

Referring to FIG. 14, the memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In some embodiments, the card interface 7100 may be a secure digital (SD) card interface or a multi-media card (MMC) interface, but the present disclosure is not limited thereto. Also, the controller 1200 may be implemented with the controller shown in FIG. 2.

The card interface 7100 may interface data exchanged between a host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 under the control of a microprocessor 6100.

In accordance with the present disclosure, a read retry range is set based on the error correction circuit included in the memory system, and one voltage within the read retry range is set as a read voltage, so that the latency of the memory system may be minimized by rapidly setting the read voltage.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps may be performed, and some steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A controller for controlling a memory device to provide read data by reading stored data using a set read voltage, in response to a read request from a host, the controller comprising:

an error correction circuit configured to check an error bit number of error bits in the read data and correct the error bits;

a read retry range setting circuit configured to reset a preset read retry range with respect to the read data, and set a new read retry range based on the error bit number and an error correction capability of the error correction circuit;

a read voltage setting circuit configured to reset the set read voltage and set, as a new read voltage, a voltage among a plurality of voltages of the reset read retry range, corresponding to the new read retry range; and a flash control circuit configured to control the memory device to perform a read retry operation on the stored data, using the new read voltage.

2. The controller of claim 1, further comprising a flash translation layer configured to generate an internal command for controlling the flash control circuit in response to the read request.

3. The controller of claim 1, wherein the read retry range setting circuit includes:

an error correction code (ECC) circuit check circuit configured to check an ECC circuit constituting the error correction circuit and generate an ECC check signal; and a read retry range setting circuit configured to reset the read retry range in response to the ECC check signal, and output reset read retry range information corresponding to the reset read retry range.

4. The controller of claim 3, wherein the read voltage setting circuit sets, as the new read voltage, one voltage among the plurality of voltages corresponding to the reset read retry range information.

5. The controller of claim 4, wherein the new read voltage includes a voltage having a median value of the plurality of voltages.

6. The controller of claim 3, wherein the ECC circuit check circuit generates the ECC check signal, which includes information on the ECC circuit and information on the error correction capability of the ECC circuit.

7. The controller of claim 3, wherein the error correction circuit outputs the error bit number by counting the error bits of fail data among the read data.

8. The controller of claim 7, wherein the read retry range setting circuit compares the error bit number with a preset threshold number, and resets the read retry range, based on the comparison result.

9. The controller of claim 8, wherein, when the error bit number is greater than the threshold number, the read retry range setting circuit resets the read retry range.

10. The controller of claim 8, wherein the set read retry range includes the new read retry range.

11. A memory system comprising:

a memory device configured to store data; and a controller configured to set a read voltage by checking an error correction capability of an error correction circuit, and control the memory device to read the stored data, using the set read voltage, in response to a read request from a host, wherein the controller is configured to reset a preset read retry range with respect to the read data and set a new read retry range based on the error correction capability.

12. The memory system of claim 11, wherein the controller includes:

the error correction circuit configured to check an error bit number of error bits in the read data and correct the error bits;

a read voltage setting block configured to reset the preset read retry range with respect to the read data, set the new read retry range based on the error bit number and the error correction capability, and set, as a new read voltage, a voltage among a plurality of voltages of the reset read retry range; and a flash control circuit configured to control the memory device to perform a read retry operation on the stored data, using the new read voltage.

13. The memory system of claim 12, wherein the read voltage setting block includes:

an error correction code (ECC) circuit check circuit configured to check an ECC circuit constituting the error correction circuit and generate an ECC check signal;

a read retry range setting circuit configured to reset the read retry range in response to the ECC check signal, wherein, when the error bit number is greater than a set number, the read retry range setting circuit sets the new read retry range, which is included in the preset read retry range; and a read voltage setting circuit configured to set, as the new read voltage, one voltage among the plurality of voltages.

14. The memory system of claim 13, wherein the ECC check signal includes information on the ECC circuit and information on the error correction capability of the ECC circuit.

15. The memory system of claim 12, wherein the new read voltage includes a voltage having a median value of the plurality of voltages.

16. A method for operating a memory system, the method comprising:

checking an error correction code (ECC) circuit and an error correction capability of the ECC circuit;

setting a read retry range including a plurality of voltages, based on the check result;

setting, as a read voltage, a voltage among the plurality of voltages;

performing a read operation of a memory device, using the set read voltage;

performing an error correction operation on read data by the read operation to determine an error bit number of the read data; and resetting the read voltage by resetting the read retry range when the error bit number is greater than a set number.

17. The method of claim 16, wherein the setting of the voltage among the plurality of voltages includes setting the new read voltage including a voltage having a median value of the plurality of voltages.

18. The method of claim 16, wherein the resetting of the read voltage includes resetting the read retry range and setting a new read retry range that is included in the read retry range and has a width narrower than that of the read retry range.

19. The method of claim 16, wherein the setting of the read retry range is performed when the memory system is power-on, when a read request is received from a host, or after a set time elapses from when the read operation is performed.

* * * * *